(12) United States Patent
Doblar et al.

(10) Patent No.: US 6,768,640 B2
(45) Date of Patent: Jul. 27, 2004

(54) COMPUTER SYSTEM EMPLOYING REDUNDANT COOLING FANS

(75) Inventors: Drew G. Doblar, San Jose, CA (US); Robert E. Cypher, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 77 days.

(21) Appl. No.: 10/184,258

(22) Filed: Jun. 28, 2002

(65) Prior Publication Data

US 2004/0001311 A1 Jan. 1, 2004

(51) Int. Cl.$^7$ ................................................ H05K 7/20
(52) U.S. Cl. ........................ 361/695; 361/694; 361/721; 174/16.1; 165/104.33; 165/122; 454/184
(58) Field of Search ................................. 361/690, 694, 361/695, 719–721; 174/16.1, 16.3, 252; 165/104.33, 122; 454/184

(56) References Cited

U.S. PATENT DOCUMENTS

| | | | |
|---|---|---|---|
| 4,931,904 A | | 6/1990 | Yiu |
| 5,247,427 A | * | 9/1993 | Driscoll et al. ............. 361/685 |
| 5,289,340 A | * | 2/1994 | Yoshifuji .................... 361/695 |
| 5,402,312 A | | 3/1995 | Kinjo et al. |
| 5,991,163 A | * | 11/1999 | Marconi et al. ............ 361/788 |
| 6,058,019 A | * | 5/2000 | Graves et al. .............. 361/760 |
| 6,388,879 B1 | * | 5/2002 | Otaguro et al. ............. 361/695 |
| 6,452,789 B1 | * | 9/2002 | Pallotti et al. .............. 361/683 |
| 6,538,881 B1 | * | 3/2003 | Jeakins et al. .............. 361/687 |
| 6,542,362 B2 | | 4/2003 | Lajara et al. |

OTHER PUBLICATIONS

Doblar et al.; A Centerplaneless Computer System; U.S. patent application Ser. No. 10/184,474; Filed Jun. 28, 2002.
Doblar et al.; Circuit Board Orientation in a Computer System; U.S. patent application Ser. No. 10/185,241; Filed Jun. 28, 2002.

* cited by examiner

Primary Examiner—Boris Chervinsky
(74) Attorney, Agent, or Firm—Meyertons Hood Kivlin Kowert & Goetzel, P.C.; B. Noël Kivlin

(57) ABSTRACT

A computer system employing redundant cooling fans. A system includes a first and a second array of circuit boards and a first and a second cooling fan. The two arrays of circuit boards are positioned such that the first array of circuit boards is substantially perpendicular to the second array of circuit boards. The first fan is positioned close to the first array of circuit boards and the second fan is positioned close to the second array of circuit boards. The first fan is positioned to force intake air across the first and the second arrays of circuit boards and the second fan is positioned to exhaust the forced intake air after it passes over the second array of circuit boards. Each of the fans may be hot swappable.

30 Claims, 15 Drawing Sheets

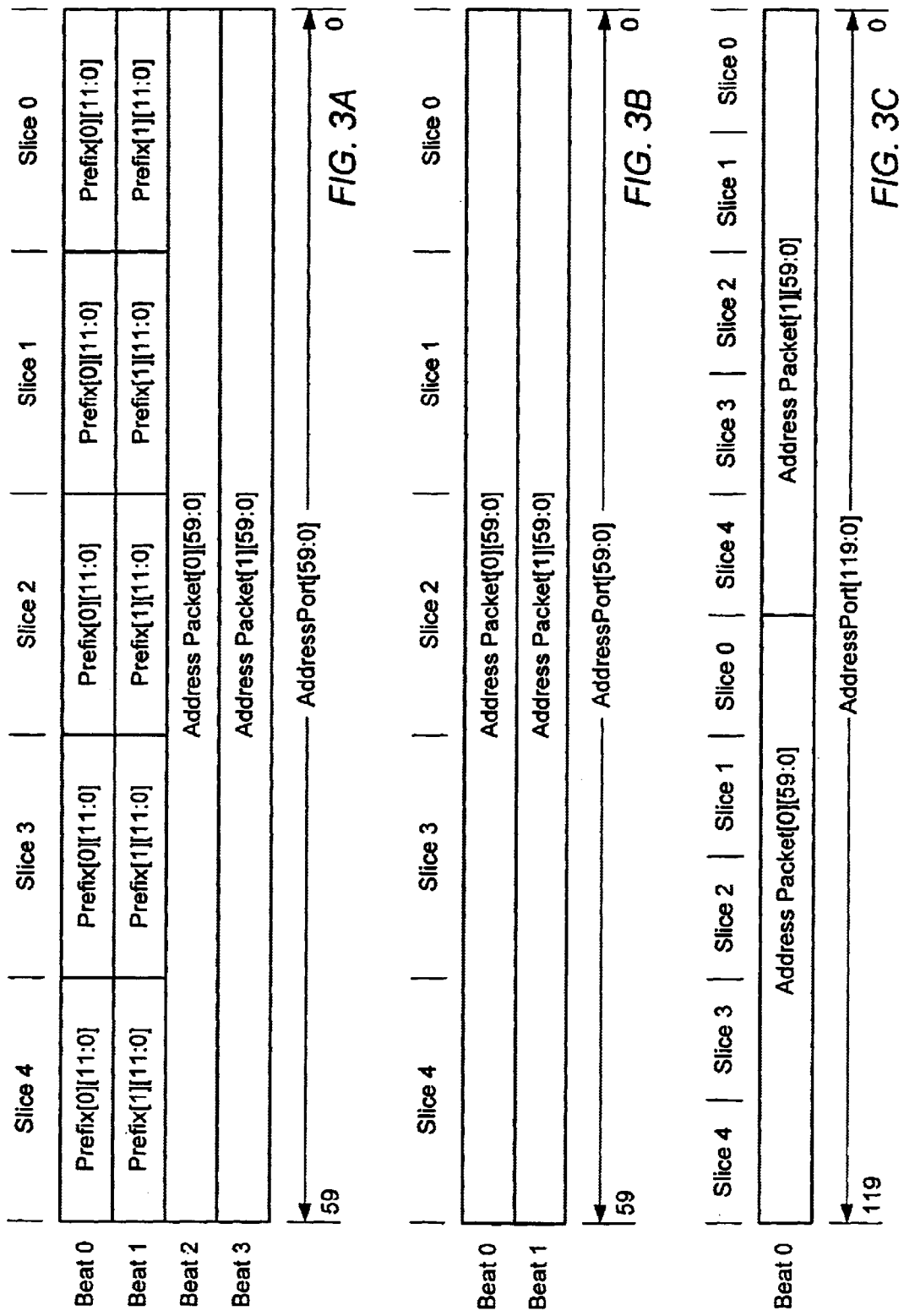

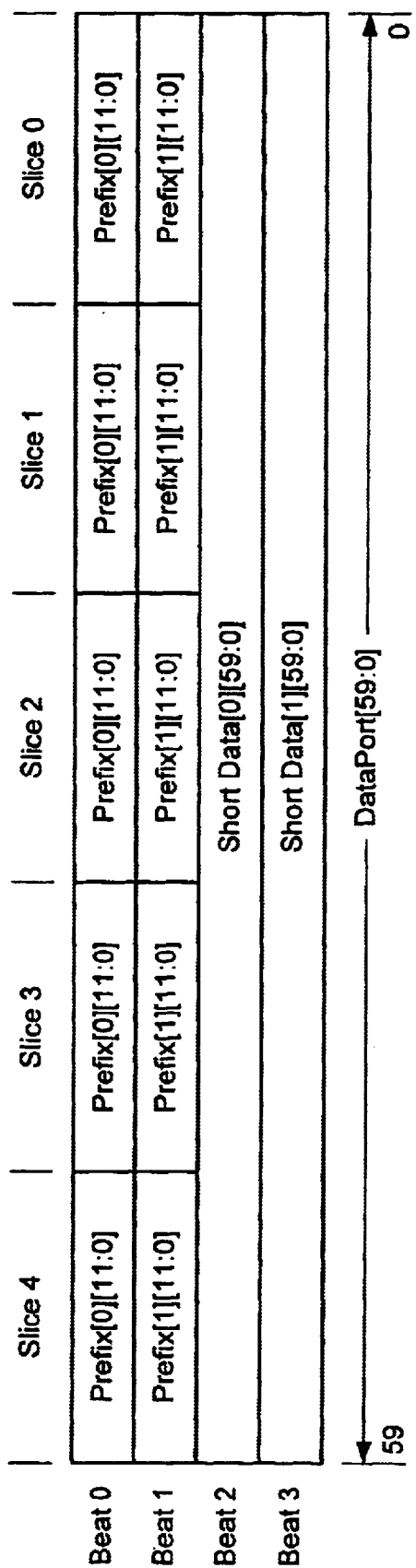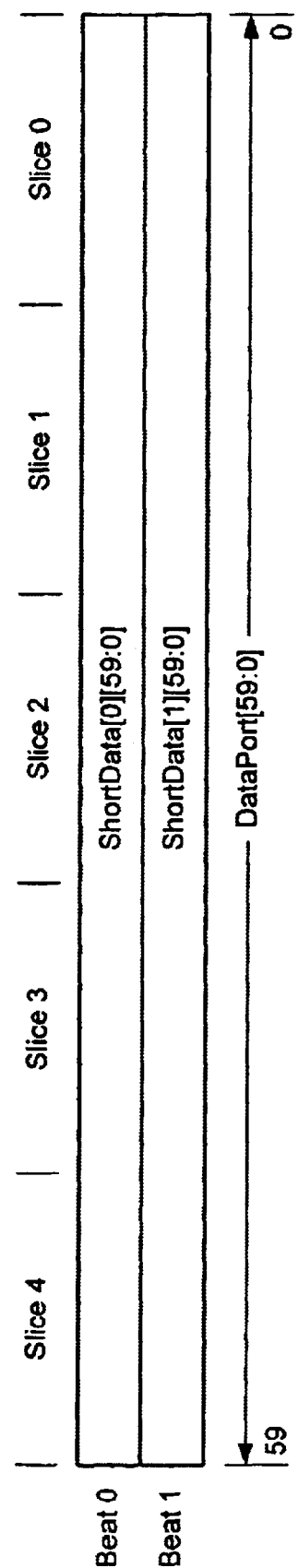

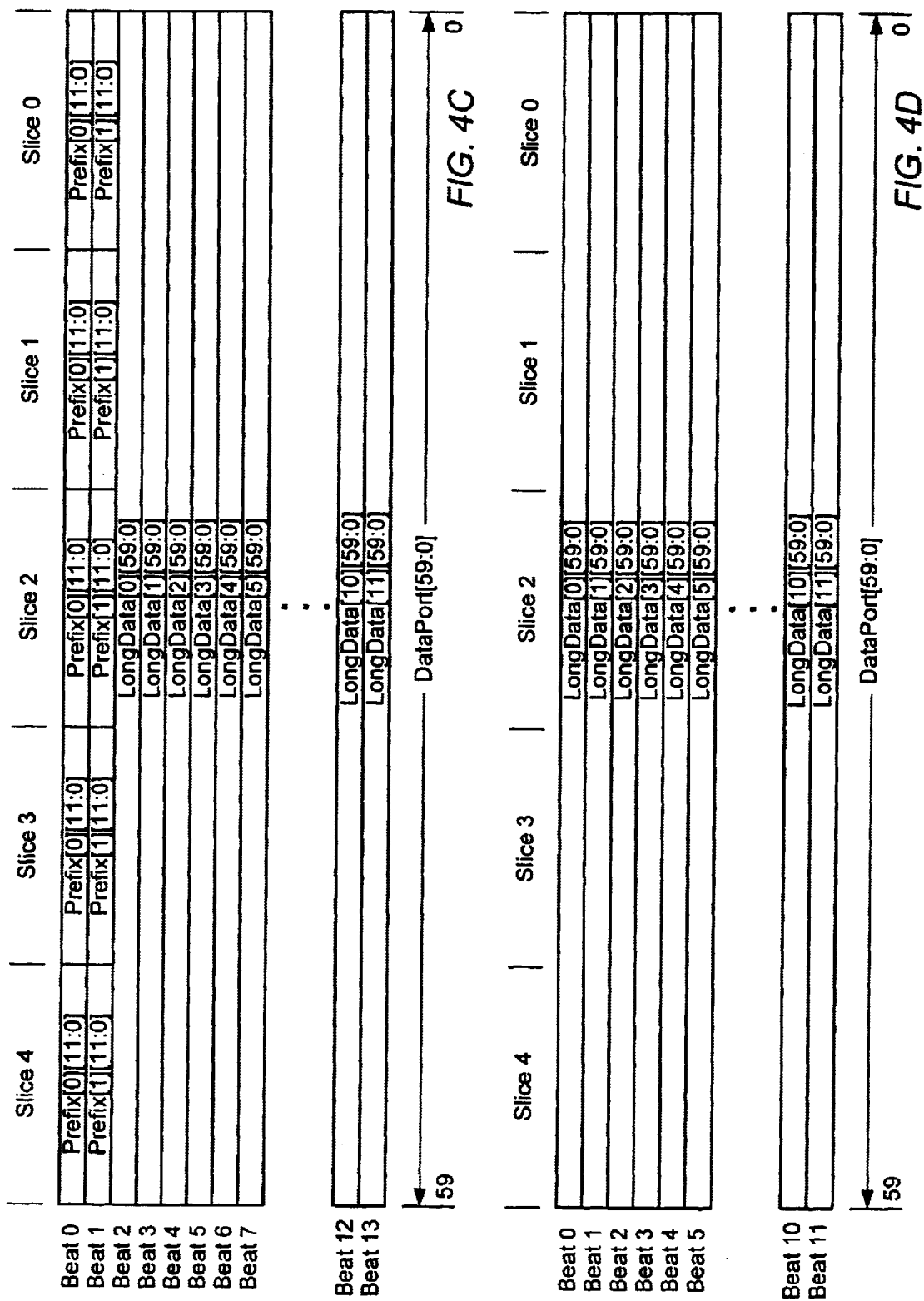

COMPUTER SYSTEM EMPLOYING REDUNDANT COOLING FANS

BACKGROUND OF THE INVENTION

1. Field of the Invention

This invention relates to computer system cooling and, more particularly, to arrangements of cooling fans in a computer system.

2. Description of the Related Art

Computer systems are typically available in a range of configurations which may afford a user varying degrees of reliability, availability and serviceability (RAS). In some systems, reliability may be paramount. Thus, a reliable system may include features designed to prevent failures. In other systems, availability may be important and so systems may be designed to have significant fail-over capabilities in the event of a failure. Either of these types of systems may include built-in redundancies of critical components. In addition, systems may be designed with serviceability in mind. Such systems may allow fast system recovery during system failures due to component accessibility. In critical systems, such as high-end servers and some multiple processor and distributed processing systems, a combination of the above features may produce the desired RAS level.

Various drawbacks may be associated with systems that provide high levels of RAS capability. For example, to provide redundancy, additional duplicate system components are usually necessary. Depending on the number of additional components, there may be an increase in overall system size. In some systems, it may be difficult to cool the additional system components and thus additional air plenums may be necessary to provide an adequate flow of cooling air. The additional plenums may also increase system size.

Many systems use a back plane or centerplane to distribute the various signals and power to the system circuit boards and components. However, the centerplane may complicate system cooling by blocking airflow through the system boards. Further, if the centerplane fails, it may not be replaceable without bringing down the system.

In addition, as the size and complexity of a system increases, other components of the system may also be difficult to service. For example, if a component fails, it is sometimes necessary to remove operative components to access the failed component. In such a case, it may be necessary to shut down one or more subsystems, which may mean losing partial or whole system functionality.

SUMMARY OF THE INVENTION

Various embodiments of a computer system employing redundant cooling fans are disclosed. In one embodiment, a system includes a first array of circuit boards, a second array of circuit boards, a first fan and a second fan. Each of the first array of circuit boards may be substantially parallel to each other and each of the second array of circuit boards may be substantially parallel to each other. The first fan may be positioned proximate to the first array of circuit boards and the second fan may be positioned proximate to the second array of circuit boards. The first array of circuit boards and the second array of circuit boards may be positioned substantially perpendicular to each other. Further, the first fan may be positioned to force intake air across the first and the second arrays of circuit boards and the second fan may be positioned to exhaust the forced intake air after it passes over the second array of circuit boards.

In another embodiment, a system includes a first plurality of circuit boards, a second plurality of circuit boards, a first plurality of fans and a second plurality of fans for cooling the first and the second plurality of circuit boards. The first plurality of circuit boards may be coupled to the second plurality of circuit boards forming a matrix of boards including a plurality of rows and a plurality of columns. The first plurality of fans may be positioned to force intake air through the plurality of rows and the plurality of columns and the second plurality of fans may be positioned to exhaust the forced intake air. Further, the intake air may flow from the first plurality of fans across the first plurality of circuit boards, across the second plurality of circuit boards to the second plurality of fans.

BRIEF DESCRIPTION OF THE DRAWINGS

FIG. 3A is a diagram of one embodiment of an address packet conveyed from a client to an address switch.

FIG. 3B is a diagram of one embodiment of an address packet conveyed from an address switch to a client.

FIG. 3C is a diagram of one embodiment of an address packet conveyed from an address switch to a client having a wide address-in port.

FIG. 4A is a diagram of one embodiment of a short data packet conveyed from a client to a data switch FIG. 4B is a diagram of one embodiment of a short data packet conveyed from a data switch to a client.

FIG. 4C is a diagram of one embodiment of a long data packet conveyed from a client to a data switch.

FIG. 4D is a diagram of one embodiment of a long data packet conveyed from a data switch to a client.

Figure 1:
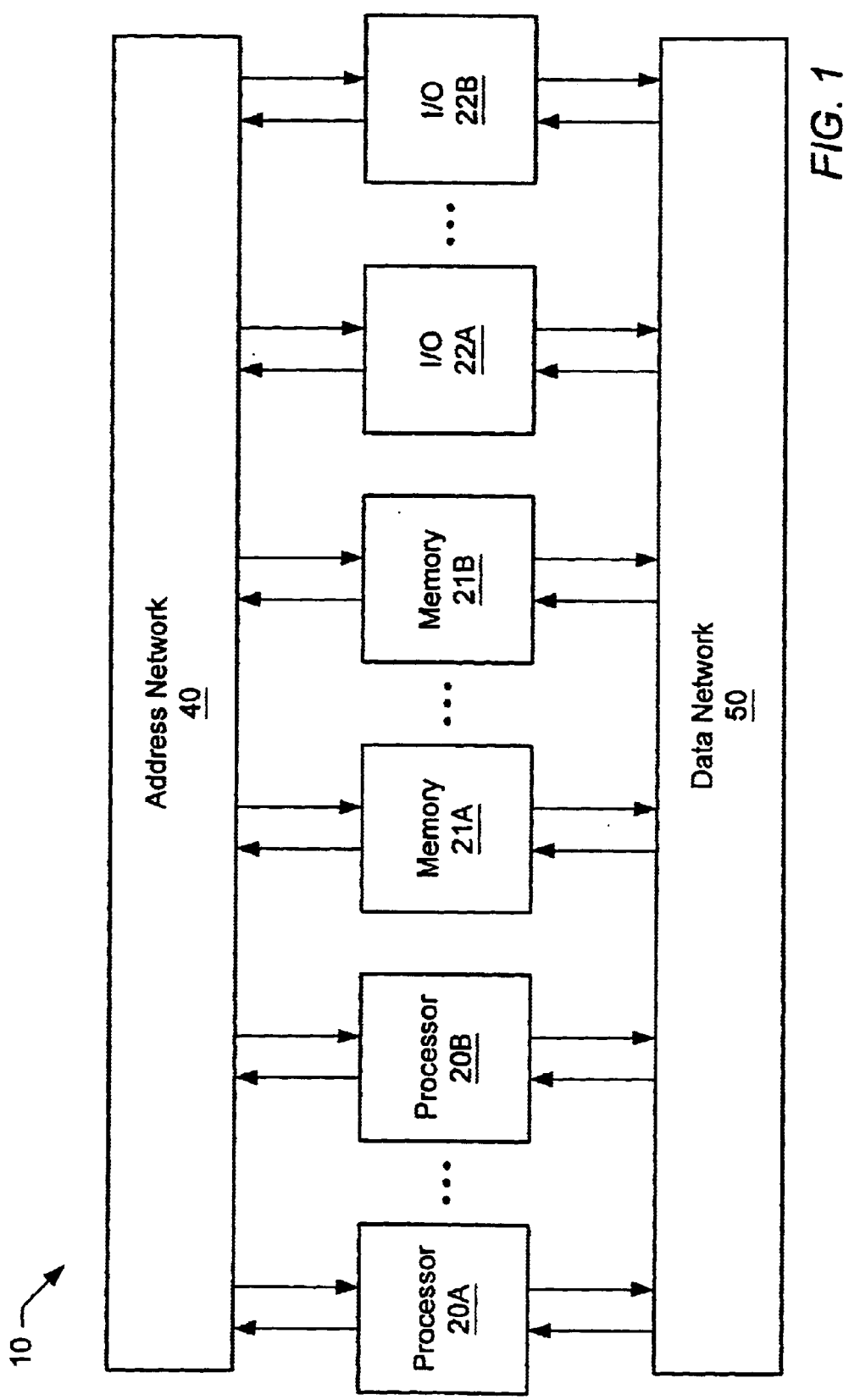
FIG. 1 is a block diagram of one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Turning now to FIG. 1, a block diagram of one embodiment of a computer system 10 is shown. Computer system 10 includes multiple client subsystems interconnected through an address network 40 and a data network 50. The embodiment of FIG. 1 may be considered a logical representation of computer system 10. The client subsystems include processor 20A and 20B, memory subsystems 21A and 21B and I/O subsystems 22A and 22B. It is noted that each of the subsystems may be referred to as a client device. It is noted that, although six client devices are shown in FIG. 1, embodiments of computer system 10 employing any number of client devices and different combinations of client device types are contemplated. Elements referred to herein with a particular reference number followed by a letter may be collectively referred to by the reference number alone. For example, processor subsystems 20A–B may be collectively referred to as processor subsystems 20. In the present embodiment, computer system 10 is a single multiprocessor node operating in a stand-alone configuration. In other embodiments however, computer system 10 may be connected to other nodes.

Generally speaking, each of processor subsystems 20 and I/O subsystems 22 may access each of memory subsystems 21. Devices configured to perform accesses to memory subsystems 21 are referred to herein as "active" devices. Each client in FIG. 1 may be configured to convey address transactions on address network 40 and data transactions on data network 50 using split-transaction packets. Each processor subsystem 20 in the illustrated embodiment may include a processor (not shown in FIG. 1). Processor subsystems 20 may further include one or more instruction and data caches which may be configured in any of a variety of specific cache arrangements. For example, set-associative or direct-mapped configurations may be employed by the caches within processor subsystems 20.

Memory subsystems 21 are configured to store data and instruction code for use by processor subsystems 20 and I/O subsystems 22. Memory subsystems 21 preferably comprise dynamic random access memory (DRAM), although other types of memory may be used. In addition, the memory within memory subsystems 21 may be configured using dual in-line memory modules (DIMM). Each address in the address space of computer system 10 may be assigned to a particular memory subsystem, referred to as the home subsystem of the address.

I/O subsystem clients 22 may each be illustrative of a peripheral device such as, for example, an input-output bridge, a graphics device, a networking device, etc. In various embodiments, I/O subsystems 22 may each include a cache memory subsystem similar to those of processor subsystems 20 for caching data associated with addresses mapped within one of the memory subsystems.

In one embodiment, data network 50 may be a logical point-to-point network. Data network 50 may be implemented as an electrical bus, a circuit-switched network, or a packet-switched network. In embodiments where data network 50 is a packet-switched network, packets may be sent through data network 50 using techniques such as wormhole, store and forward, or virtual cut-through. In a circuit-switched network, a particular client device may communicate directly with a second client device via a dedicated point-to-point link that may be established through a switched interconnect mechanism. To communicate with a third client device, the particular client device utilizes a different link as established by the switched interconnect than the one used to communicate with the second client device.

In the embodiment of FIG. 1, address network 40 accommodates communication between processing subsystems 20, memory subsystems 21, and I/O subsystems 22. Messages upon address network 40 are generally referred to as address packets. When an address packet references a storage location within a memory subsystem 21, the referenced location may be specified via an address conveyed within the address packet upon address network 40. Subsequently, data corresponding to the transaction on the address network 40 may be conveyed upon data network 50.

Similar to data network 50, address network 40 may be implemented as an electrical bus, a circuit-switched network, or a packet-switched network. Address network 40 may implement a broadcast network in which address transactions are conveyed to all client devices. Address network 40 may be embodied in hardware that is separate from data network 50, or in hardware that is shared with data network 50.

As will be described further below in conjunction with the description of FIG. 2, to increase system reliability and availability, address network 40 and data network 50 may be implemented in multiple pieces. Each piece of address network 40 may convey a portion of the address packet body and a portion of an associated error code and each piece of data network 50 may convey a portion of the data packet body and a portion of an associated error code. Further, one or more of the pieces of address network 40 and one or more of the pieces of data network 50 may convey only the parity portion of the error codes of the other pieces. Each piece may be referred to as a "slice."

Figure 2:
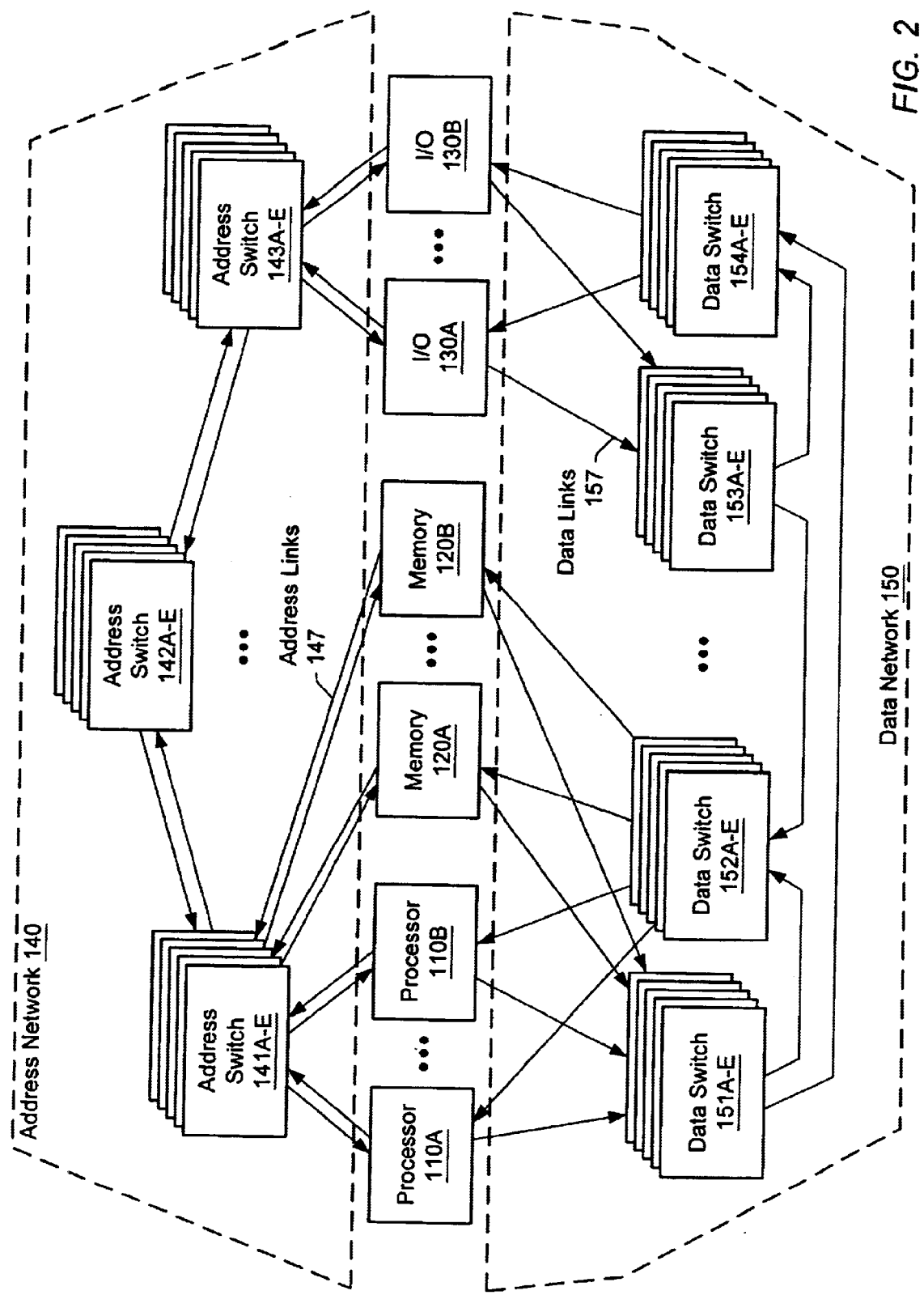
FIG. 2 is a diagram of one embodiment of a computer system.

Referring to FIG. 2, a diagram of one embodiment of a computer system 100 is shown. Similar to the embodiment of FIG. 1, computer system 100 of FIG. 2 includes multiple clients interconnected through an address network 140 and a data network 150. The embodiment of FIG. 2 may be thought of as one particular configuration of a computer system such as computer system 10 of FIG. 1. In FIG. 2, address network 140 and data network 150 are three stage and two-stage switched networks, respectively, including a plurality of address switches and a plurality of data switches. The clients include processor clients 110A–B, memory subsystem clients 120A–B and I/O subsystem clients 130A–B. It is noted that although only two clients from each category are shown in the configuration of the illustrated embodiment, other embodiments may include different numbers of clients in this type of configuration. It is also noted that in other embodiments, any number of client subsystems and corresponding configurations may be used. Computer system 100 may operate in much the same way as the embodiment described above in conjunction with FIG. 1. It is noted that many physical configurations may be implemented to scale computer system 100. For example, systems containing fewer numbers of clients are contemplated. Such systems may use single stage switch networks (not shown). It is further contemplated that systems containing only a few clients may need no address switches and processor subsystem address links may be connected directly to memory subsystems.

In FIG. 2, address network 140 includes three groups of address switches, labeled 141A–E, 142A–E and 143A–E. As used herein and described in greater detail in conjunction with the description of FIG. 8, an address switch may be implemented as an integrated circuit containing many individual switches and circuits. Each address switch group includes five switches which represent five address slices. To illustrate, address switch 141A may correspond to slice 0, address switch 141B may correspond to slice 1, and so forth. Address switch 141E may represent parity of slices 0–3. As will be described in greater detail below in conjunction with FIG. 3A through FIG. 3C, slices 0–3 correspond to address bits and error detecting/correcting code bits of an address packet and slice 4 of may correspond to parity of each of slices 0–3. Likewise, data network 150 includes four groups of data switches, labeled 151A–E, 152A–E, 153A–E and 154A–E. As used herein and described in greater detail in conjunction with the description of FIG. 8, a data switch may be implemented as an integrated circuit containing many individual switches and circuits. Each data switch group includes five switches which represent five data slices. To illustrate, data switch 151A may correspond to slice 0, data switch 151B may correspond to slice 1, and so forth. Data switch 151E may represent parity of slices 0–3. As will be described in greater detail below in conjunction with FIG. 4A through FIG. 4D, slices 0–3 correspond to data bits and error detecting/correcting code bits of a data packet and slice 4 may correspond to parity of each of slices 0–3. In one embodiment, each parity slice is the exclusive-OR (XOR) of the respective slices 0–3. It is noted that although five slices are used in the illustrated embodiment, it is contemplated that other embodiments may include other numbers of slices.

Address links 147 are used to interconnect clients to address switches and address switches to other address switches. Similarly, data links 157 are used to interconnect clients to data switches and data switches to other data switches. Address links 147 and data links 157 may be coupled to an address interface (not shown) and a data interface (not shown) which may be included on each client. As described above, the address interface may be unidirectional, point-to-point and source-synchronous and may include an address-in port and an address-out port. Each address-in port of a client may be either a five or a ten-link port depending on whether the port is configured to be a narrow or a wide port, respectively. Each link may have 12 signals. The data interface may also be unidirectional, point-to-point and source-synchronous and may include a data-in port and a data-out port. Each data port may include 5 links of 12 signals each. It is noted that other embodiments are contemplated which include other numbers of links and other numbers of signals on a given interface.

FIG. 3A through FIG. 3C illustrate various formats of address packets that may be conveyed between clients and address switches. An address packet sent out over the address network may be 120 bits wide. However depending on whether the interface receiving the packet is narrow or wide, the address packet may be sent using one or more clock phases or beats. Also, an address packet sent from a client to an address switch may be preceded by a routing prefix. Conversely, an address packet sent from an address switch to a client need not be preceded by a routing prefix. The routing prefix may include routing information such as destination information, whether a non-NULL packet follows, etc. The routing prefix is 24 bits and may include 14 bits of prefix body and 10 bits of error detection/correction code (ECC) bits. It is noted that in other embodiments, other numbers of prefix bits and ECC bits may be used. The 120-bit address packet may include a 74-bit address body, a five-bit packet class and 41 ECC bits, of which 24 of the bits may be parity bits.

Turning now to FIG. 3A, a diagram of one embodiment of an address packet conveyed from a client to an address switch is shown. Since the address packet is being sent to an address switch, a prefix precedes the packet. The address packet and prefix are being conveyed over 5 links each having 12 signals. As described above, the address packet may be divided into 5 slices with one of the slices conveying the parity of the other 4 slices. FIG. 3A illustrates how the various portions of the prefix and the address packet are sent and divided across the slices. Each slice is conveyed over a corresponding 12-signal link.

To convey the address packet and prefix to the narrow port, the packet is sent out over 4 beats. During beat zero, the first half of the identical routing prefix is sent on all five slices. During beat one, the second half of the identical routing prefix is sent on all five slices. During beat two, the first half of the address packet [0][59:0] is sent. During beat three, the second half of the address packet [1][59:0] is sent. Thus in the illustrated embodiment, slices 0–3 may convey address body, packet class, and a portion of the ECC bits, while slice 4 may convey the parity bits.

Referring to FIG. 3B, a diagram of one embodiment of an address packet conveyed from an address switch to a client having a narrow address-in port is shown. Since the address packets are being sent from an address switch to a client the address packets are not preceded by a routing prefix. FIG. 3B illustrates how the various portions of the address packet are sent and divided across the slices. Each slice is conveyed over a corresponding 12-signal link.

To convey the address packet to the narrow port, the packet is sent out over 2 beats. During beat zero, the first half of the address packet [0][59:0] is sent. During beat one, the second half of the address packet [1][59:0] is sent. Thus in the illustrated embodiment, slices 0–3 may convey address body, packet class, and a portion of the ECC bits, while slice 4 may convey the parity bits.

Referring to FIG. 3C, a diagram of one embodiment of an address packet conveyed from an address switch to a client having a wide address-in port is shown. Again, since the address packet is being sent from an address switch to a client, the address packet need not be preceded by a routing prefix. The address packet is being conveyed to a wide port having 10 links of 12 signals and thus only a single beat may be necessary.

The address packet is divided into two groups of 60 bits each. Each group is then divided into five slices with one of the slices of each group conveying the parity of the other four slices of that group. Each slice is conveyed over a corresponding 12-signal link. During beat zero, both the first half of the address packet [0][59:0] and the second half of the address packet [1][59:0] are sent. Thus in the illustrated embodiment, slices 0–3 of each group may convey address body, packet class, and a portion of the ECC bits, while slice 4 of each group may convey the parity bits of the respective half of the packet.

FIG. 4A through FIG. 4D illustrate how various formats of data packets are conveyed between clients and data switches. In general, data packets may be sent out over the data network as either short data packets or long data packets. Short data packets may include 120 bits and long data packets may include 720 bits. Data packets sent from a client to a data switch or from a data switch to another data switch may be preceded by a routing prefix. Data packets sent from a data switch to a client need not be preceded by a routing prefix.

The routing prefix may include routing information such as destination information, whether a non-NULL packet follows, length of the data packet, etc. The routing prefix is 24 bits and may include 14 bits of prefix body and 10 bits of error detection/correction code (ECC) bits. It is noted that in other embodiments, other numbers of prefix bits and ECC bits may be used.

The 120-bit short data packet may include a 74-bit short data body, a five-bit packet class and 41 ECC bits, which include 24 parity bits. The 720-bit long data packet may include a 576-bit long data body, a eight-bit packet class and 174 ECC bits, which includes 144 parity bits. Further, as described above, data-in ports may be narrow and include five links of 12 signals each.

Turning to FIG. 4A, a diagram of one embodiment of a short data packet conveyed from a client to a data switch is shown. Since the data packet is being conveyed to a data switch, it is preceded by a prefix. FIG. 4A illustrates how the various portions of the prefix and the data packet are sent and divided across the slices. Each slice is conveyed over a corresponding 12-signal link.

To convey the short data packet and the prefix, the short data packet and prefix are sent out over 4 beats. During beat zero, the first half of the identical routing prefix is sent on all five slices. During beat one, the second half of the identical routing prefix is sent on all five slices. During beat two, the first half of the short data packet [0][59:0] is sent. During beat three, the second half of the short data packet [1][59:0] is sent. Thus in the illustrated embodiment, slices 0–3 may convey short data body, packet class, and a portion of the ECC bits, while slice 4 may convey the parity bits.

Referring to FIG. 4B, a diagram of one embodiment of a short data packet conveyed from a data switch to a client is shown. Since the short data packet is being sent from a data switch to a client the short data packet is not preceded by a routing prefix. FIG. 4B illustrates how the various portions of the short data packet are sent and divided across the slices. Each slice is conveyed over a corresponding 12-signal link.

To convey the short data packet, the data packet is sent out over 2 beats. During beat zero, the first half of the short data packet [0][59:0] is sent. During beat one, the second half of the short data packet [1][59:0] is sent. Thus in the illustrated embodiment, slices 0–3 may convey data body, packet class, and a portion of the ECC bits, while slice 4 may convey the parity bits.

Turning to FIG. 4C, a diagram of one embodiment of a long data packet conveyed from a client to a data switch is shown. Since the long data packet is being conveyed to a data switch, it is preceded by a prefix. FIG. 4C illustrates how the various portions of the prefix and the long data packet are sent and divided across the five slices. Each slice is conveyed over a corresponding 12-signal link.

To convey the long data packet and the prefix, the data packet and prefix are sent out over 14 beats. During beat zero, the first half of the identical routing prefix is sent on all five slices. During beat one, the second half of the identical routing prefix is sent on all five slices. During beat two, the first 60-bit portion of the long data packet [0][59:0] is sent. During beat three, the second 60-bit portion of the long data packet [1][59:0] is sent. During beats 4–13 the remaining 60-bit portions of the long data packet are sent. In each beat, slices 0–3 may convey the long data body, while slice 4 may convey the parity bits.

Referring to FIG. 4D, a diagram of one embodiment of a long data packet conveyed from a data switch to a client is shown. Since the long data packet is being sent from a data switch to a client the long data packet is not preceded by a routing prefix. FIG. 4D illustrates how the various portions of the long data packet are sent and divided across the five slices. Each slice is conveyed over a corresponding 12-signal link.

To convey the long data packet on the narrow port, the data packet is sent out over 12 beats. During beat zero, the first 60-bit portion of the long data packet [0][59:0] is sent. During beats 1–11 the remaining 60-bit portions of the long data packet are sent. In each beat, slices 0–3 may convey the long data body, while slice 4 may convey the parity bits.

It is noted that although the embodiments shown in FIG. 3A through FIG. 4D illustrate the address and data packets being divided into 5 slices, it is contemplated that the system may continue to operate using only four of the five slices. For example, when a failure in one of the slices prevents using five slices, four slices may be used. The system may send an address and/or data packet using only the four good slices and the bits of the bad slice may not be sent. Since error detection/correction codes are sent with the address and data packets, the missing slice may be reconstructed at the packet destination using the parity slice.

The following illustrations of FIG. 5 through FIG. 9 depict various embodiments of circuit boards which may be used to implement a centerplaneless computer system. It is noted that each of the circuit boards may be any type of circuit board such as a printed circuit board, for example. In addition, FIG. 10 through FIG. 12 illustrate physical configurations of an embodiment of the centerplaneless computer system. It is noted that any of the circuit boards described below may be referred to generally as "system boards."

Figure 5:
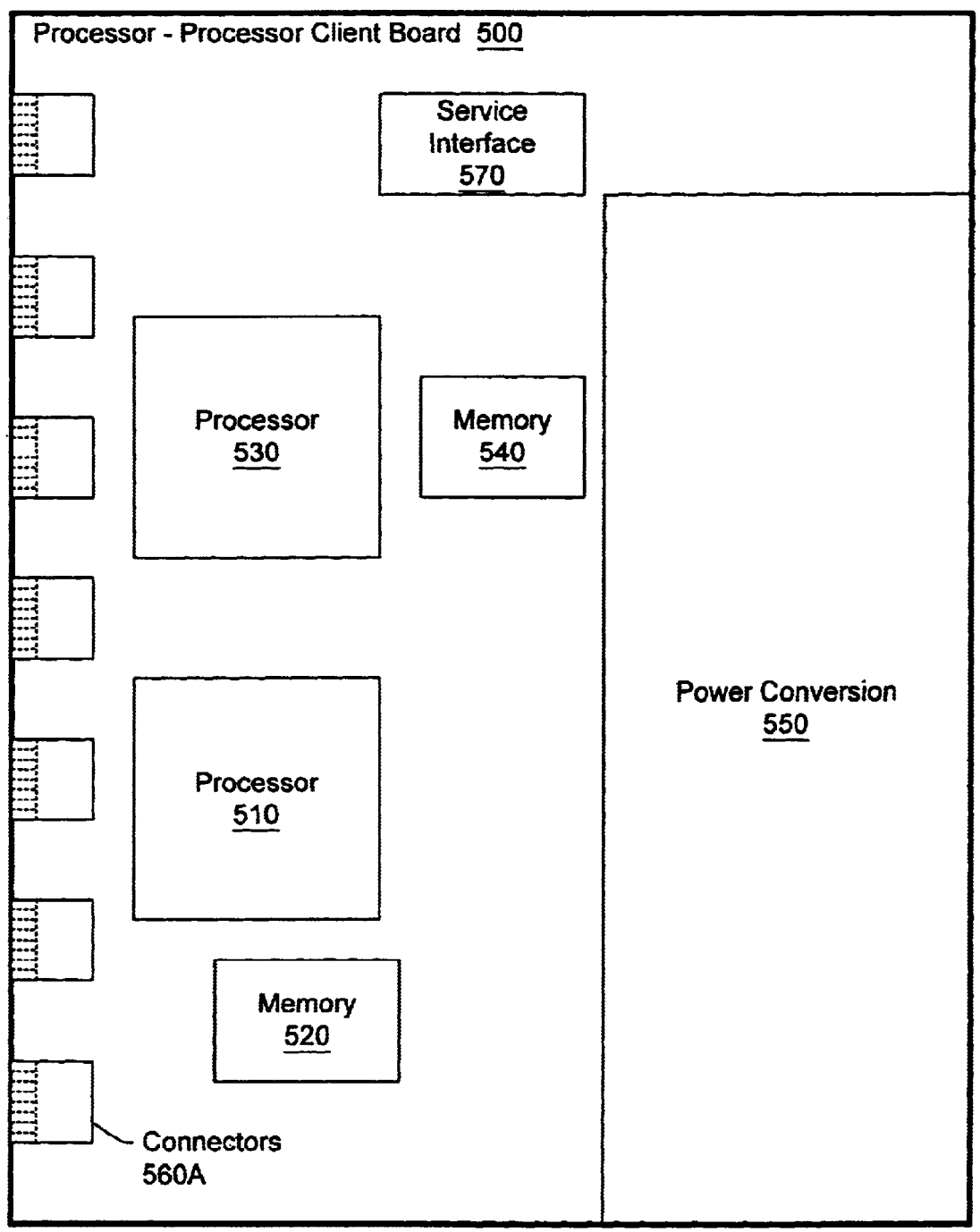
FIG. 5 is a diagram of one embodiment of a dual client processor board of a computer system.

Turning to FIG. 5, a diagram of one embodiment of a dual client processor board 500 of a computer system is shown. The dual client processor board 500 includes a circuit board including two processors, such as the processors of the computer systems illustrated in FIG. 1 and FIG. 2. Each processor on dual client processor board 500 is an independent processor client. The first processor client includes a processor 510 and a memory 520. The second processor client also includes a processor 530 and a memory 540. In addition, dual processor client board 500 includes a power conversion block 550 and a service interface 560. Dual client processor board 500 connects to the rest of the computer system via a plurality of connectors 570.

Processor 510 and processor 530 are each illustrative of for example, an UltraSPARC™ microprocessor such as an UltraSPARC™ 5 microprocessor by Sun Microsystems, Inc. It is contemplated however, that in other embodiments, other processors may be used.

Memory 520 may be used as a cache memory for processor 510 as described above in conjunction with the description of FIG. 1. Memory 520 may be implemented in static random access memory (SRAM). Likewise, memory 540 may be used as a cache memory for processor 530 and may be implemented in static random access memory (SRAM).

Power conversion block 550 may be a DC to DC converter configured to provide a DC operating voltage for components on the dual client processor board 500. In one embodiment, power conversion block 550 may convert 48VDC to 1VDC. As will be described in greater detail below, redundant 48V power distribution boards may supply 48V to each client board in the computer system. Power conversion block 550, receives the redundant 48V and converts it to a single 1VDC supply. It is contemplated that in other embodiments, power conversion block may provide other suitable voltages as necessary. Further, in an alternative embodiment, power conversion block may provide redundant 1VDC supplies.

Service interface 570 is a service module configured to provide a service interface from each client, which in the illustrated embodiment are processors, to a service processor board (not shown in FIG. 5) via a special service bus (not shown). In one embodiment, service interface 570 may be a custom integrated circuit configured to translate communications between the service bus protocol and the protocol used by processor 510 and 530. As will be described in greater detail below, the service interface may allow the service processor to configure processor 510 and 530 into system domains and to diagnose failures on dual client processor board 500.

Connectors 560A are configured to convey power, ground and signal information between dual client processor board 500 and switch and power boards (not shown in FIG. 5). Each of connectors 560A may be physically arranged along one edge and mounted to one side of dual client processor board 500. As will be described in further detail below, each of connectors 560A may be detachably mated to a corresponding connector on the switch and power boards.

Figure 6:
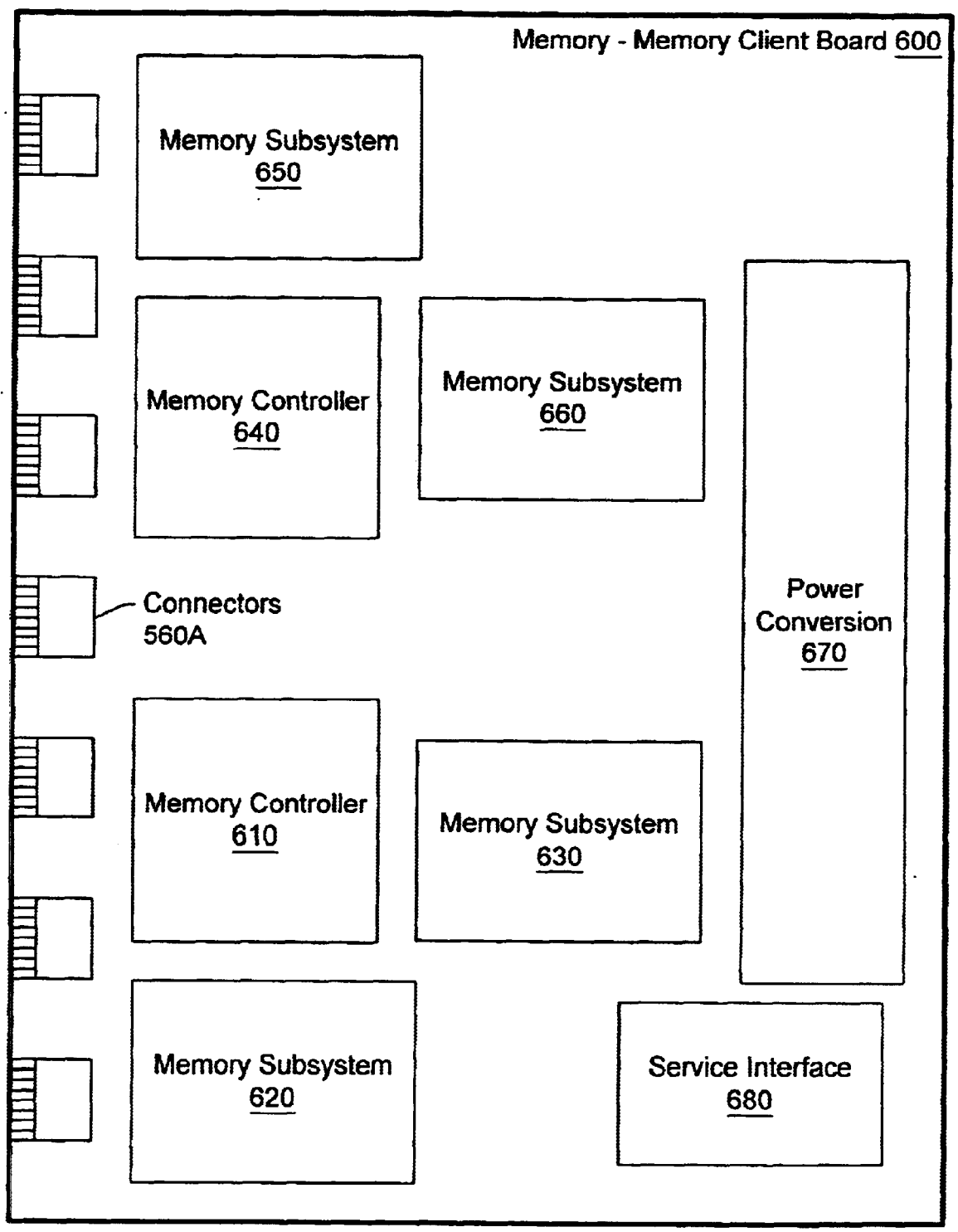
FIG. 6 is a diagram of one embodiment of a dual client memory board of a computer system.

Turning to FIG. 6, a diagram of one embodiment of a dual client memory board 600 is shown. Dual client memory board 600 includes a circuit board including two memory clients, such as the memory clients of the computer systems illustrated in FIG. 1 and FIG. 2. Each memory client on dual client memory board 500 is an independent memory client. The first memory client includes a memory controller 610 and two independent memory subsystems 620 and 630. The second memory client includes a memory controller 640 and two additional independent memory subsystems 650 and 660. Dual client memory board 600 also includes a power conversion block 670 and a service interface 680. Further, dual client memory board 600 connects to the rest of the computer system via a plurality of connectors 560A. It is noted that connectors 560A are similar to connectors 560A of FIG. 5 and thus labeled identically.

Each memory controller may be configured to control memory transactions involving their respective memory subsystems. In one embodiment, memory subsystem 620 and memory subsystem 630 may each be implemented using DIMMs which each include a plurality of DRAM chips. The DRAM chips on each DIMM may be grouped into multiple banks. The DIMMs may be implemented to include error detection/error correction capability. The error detection/error correction capability may include using redundant DIMMs to store parity information. Each memory controller may also be configured to control interleaving of data across the memory banks of each of the memory subsystems.

Similar to the description of power conversion block 550 of FIG. 5, power conversion block 670 of FIG. 6 may be a DC to DC converter configured to provide a DC operating voltage for components on the dual client memory board 600. In one embodiment, power conversion block 670 may convert 48VDC to 1VDC.

Service interface 680 of FIG. 6 is a service module configured to provide an interface from each memory controller to a service processor (not shown in FIG. 6) via a special service bus (not shown). Similar to the service interface described in FIG. 5, service interface 680 may be a custom integrated circuit configured to translate communications between the service bus protocol and the protocol used by memory controller 610 and 640.

Connectors 560A of FIG. 6 are configured to convey power, ground and signal information between dual client memory board 600 and switch and power boards (not shown in FIG. 6). Each of connectors 6560A may be physically arranged along one edge and mounted to one side of dual client memory board 600. As will be described in further detail below, each of connectors 560A may be detachably mated to a corresponding connector on the switch and power boards.

Figure 7:
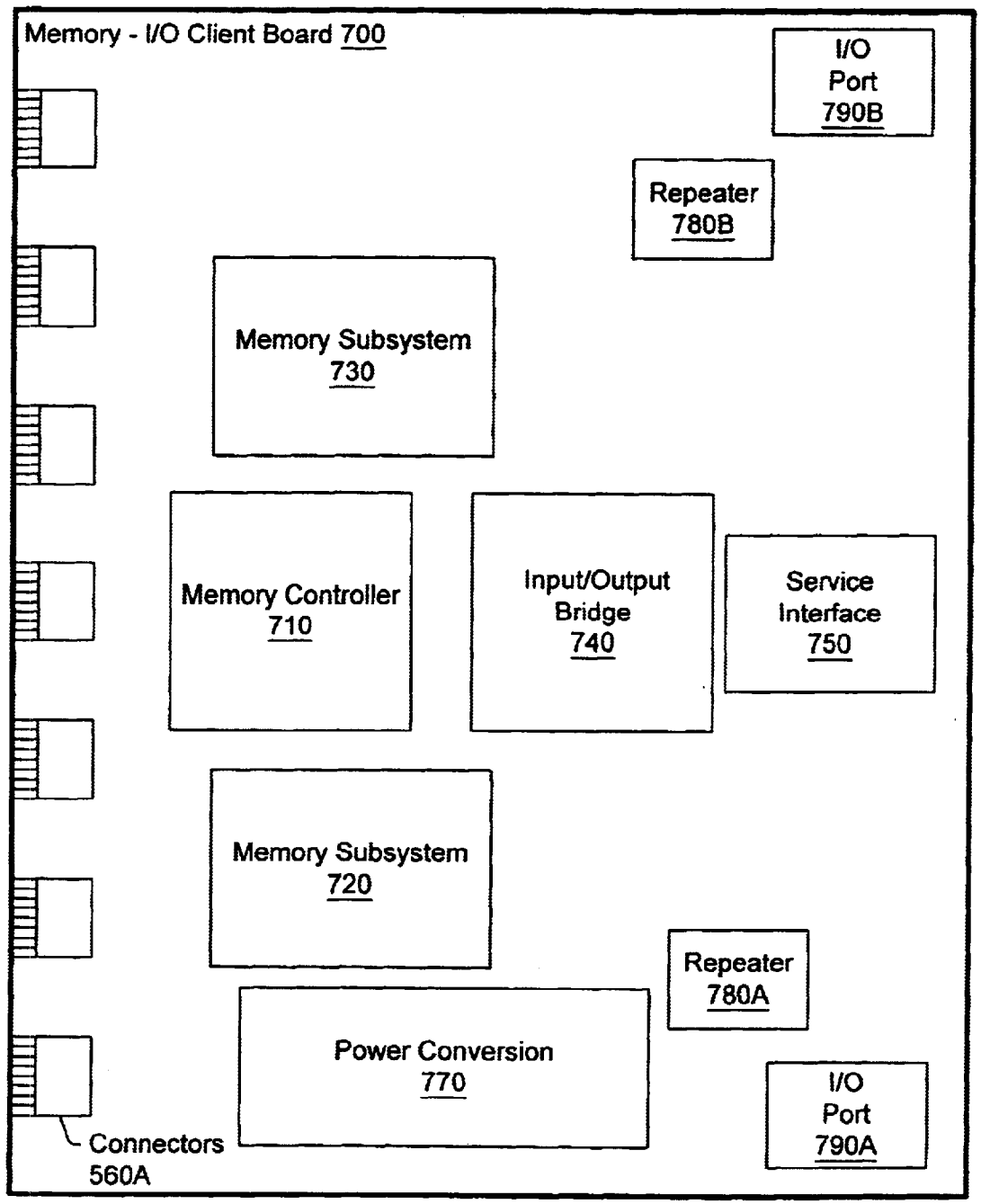
FIG. 7 is a diagram of one embodiment of a dual client memory—I/O board of a computer system.

Referring to FIG. 7, a diagram of one embodiment of a dual client memory—I/O board 700 is shown. The dual client memory—I/O board 700 includes a circuit board including a memory client and an I/O bridge client, such as the memory clients and I/O clients of the computer systems illustrated in FIG. 1 and FIG. 2. The memory client includes a memory controller 710 and two memory subsystems 720 and 730. The I/O bridge client includes an I/O bridge 740 and two I/O ports, 790A and 790B. Dual client memory—I/O board 700 also includes a power conversion block 770 and a service interface 750. Further, dual client memory—I/O board 700 includes a plurality of connectors 760.

The memory client of FIG. 7 including memory controller 710 and memory subsystems 720 and 730, operates in a manner that is similar to each of the memory clients described above in conjunction with the description of FIG. 6.

I/O bridge 740 is configured to provide an interface between memory controller and 710 devices that may be connected externally to the computer node. I/O ports 790A and 790B may provide the physical I/O ports for I/O bridge 740. In one embodiment, I/O bridge 740 may translate Infiniband™ transactions into transactions suitable for use by memory controller 710 and vice versa. I/O ports 790AB may be InfiniBand™ ports and may provide 12 parallel Infiniband™ channels per port. Further, I/O ports 790AB may transmit and receive InfiniBand™ transactions via fiber optic cable.

Power conversion block 770 and service interface 750 operate in a manner that is similar to the power conversion blocks and service interfaces described above in conjunction with the descriptions of FIG. 5 and FIG. 6.

Similar to the connectors described above in FIG. 5 and FIG. 6, connectors 560A of FIG. 7 are configured to convey power, ground and signal information between dual client memory—I/O board 700 and switch and power boards (not shown in FIG. 7). Each of connectors 560A may be physically arranged along one edge and mounted to one side of dual client memory board 700. Each of connectors 560A may be detachably mated to a corresponding connector on the switch and power boards. It is noted that although seven connectors are shown on the circuit boards of FIG. 5 through FIG. 7, it is contemplated that in other embodiments, other numbers of connectors may be used.

It is noted that although the various client boards above are described as being dual client boards, it is contemplated that in other embodiments client boards having other numbers of clients may be used. For example, a board having a single client may be used or alternatively, a multi-client board having three or more clients may be used.

Figure 8:
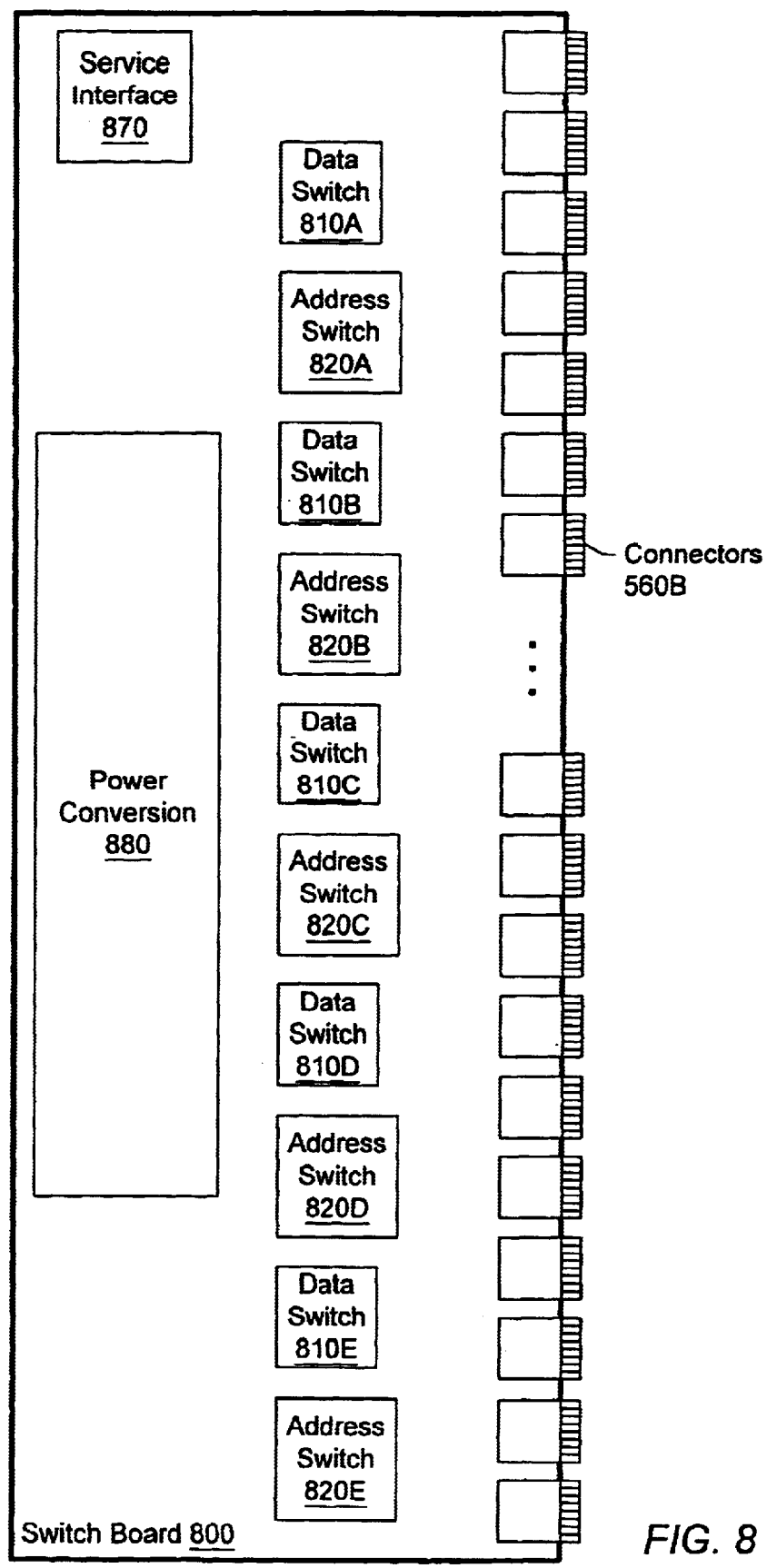
FIG. 8 is a diagram of one embodiment of a switch board of a computer system.

Turning to FIG. 8, a diagram of one embodiment of a switch board is shown. Switch board 800 includes a circuit board including a plurality of data switches 810A through 810E and a plurality of address switches 820A through 820E such as the address and data switches described in conjunction with the description of FIG. 2. Switch board 800 also includes a power conversion block 880 and a service interface 870. Further, Switch board 800 includes a plurality of connectors 860.

Data switches 810A–E may be configured to provide routing of data packets within the computer system as described above in FIG. 2. Address switches 820A–E may be configured to route address packets as described above in FIG. 2. Hereafter, data switches 810A–E and address switches 820A–E may be referred to collectively as data switches 810 and address switches 820, respectively. Data switches 810 may include a data-in and a data-out port as described above in FIGS. 4A though 4D. Address switches 820 may include an address-in and an address-out port as described above in FIGS. 3A through 3C.

In one embodiment, data switches 810 and address switches 820 may each be a custom integrated circuit capable of being programmed as an address switch or a data switch. When the custom integrated circuit is programmed as an address switch, it may accommodate different address-in and address-out port configurations as described above in conjunction with the description of FIGS. 3A–C. Likewise, when the custom integrated circuit is programmed as a data switch, it may accommodate different data-in and data-out port configurations. For example, the integrated circuit may be programmed to have multiple address ports or data ports. In the illustrated embodiment, there are five data switches and five address switches. If used with up to four other switch boards, this particular implementation is intended to provide address and data switching for up to 40 clients in a computer system. However, it is contemplated that other embodiments may use other numbers of address and data switches and other numbers of switch boards to accommodate other numbers of clients. In an alternative embodiment, the custom integrated switch may be specific to either a data switch or an address switch.

Power conversion block 880 and service interface 870 operate in a manner similar to the power conversion blocks and service interfaces described above in conjunction with the descriptions of FIG. 5, FIG. 6 and FIG. 7.

Connectors 560B are configured to convey signal information between the various dual client boards and to convey power and ground from the service processor boards (not shown in FIG. 8). Each of connectors 560B may be physically arranged along one edge and mounted to one side of switch board 800. Each of connectors 560B may be detachably mated to a corresponding connector (560A) on each of the dual client boards and the service processor boards. It is noted that the number of connectors in the present embodiment may be dependent upon the size of switch board 800 which may be dependent upon the number of client boards that the computer system is designed to use. Thus, it is contemplated that any suitable number of connectors may be used.

Figure 9:
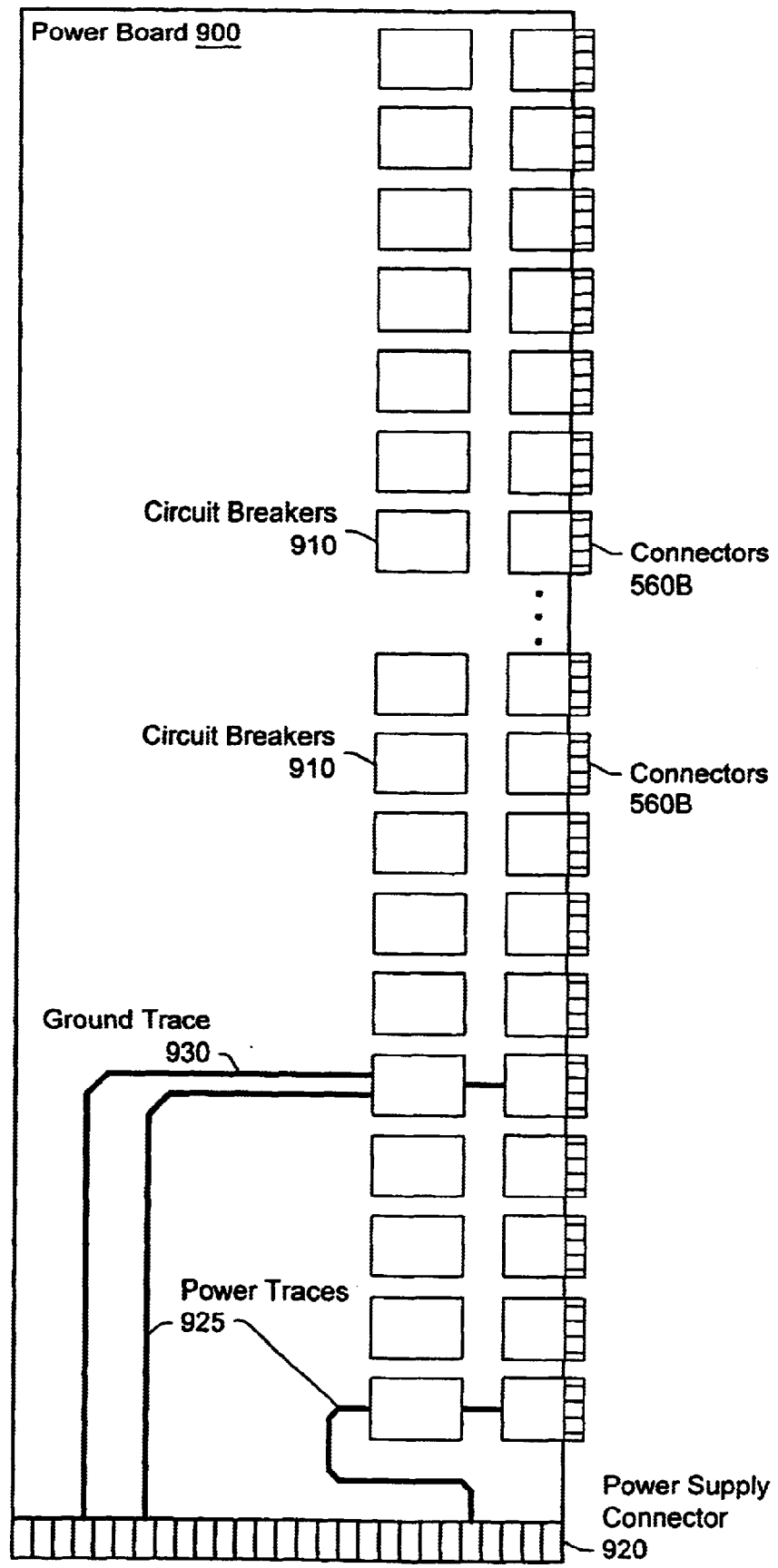
FIG. 9 is a diagram of one embodiment of a power distribution board of a computer system.
Figure 10:
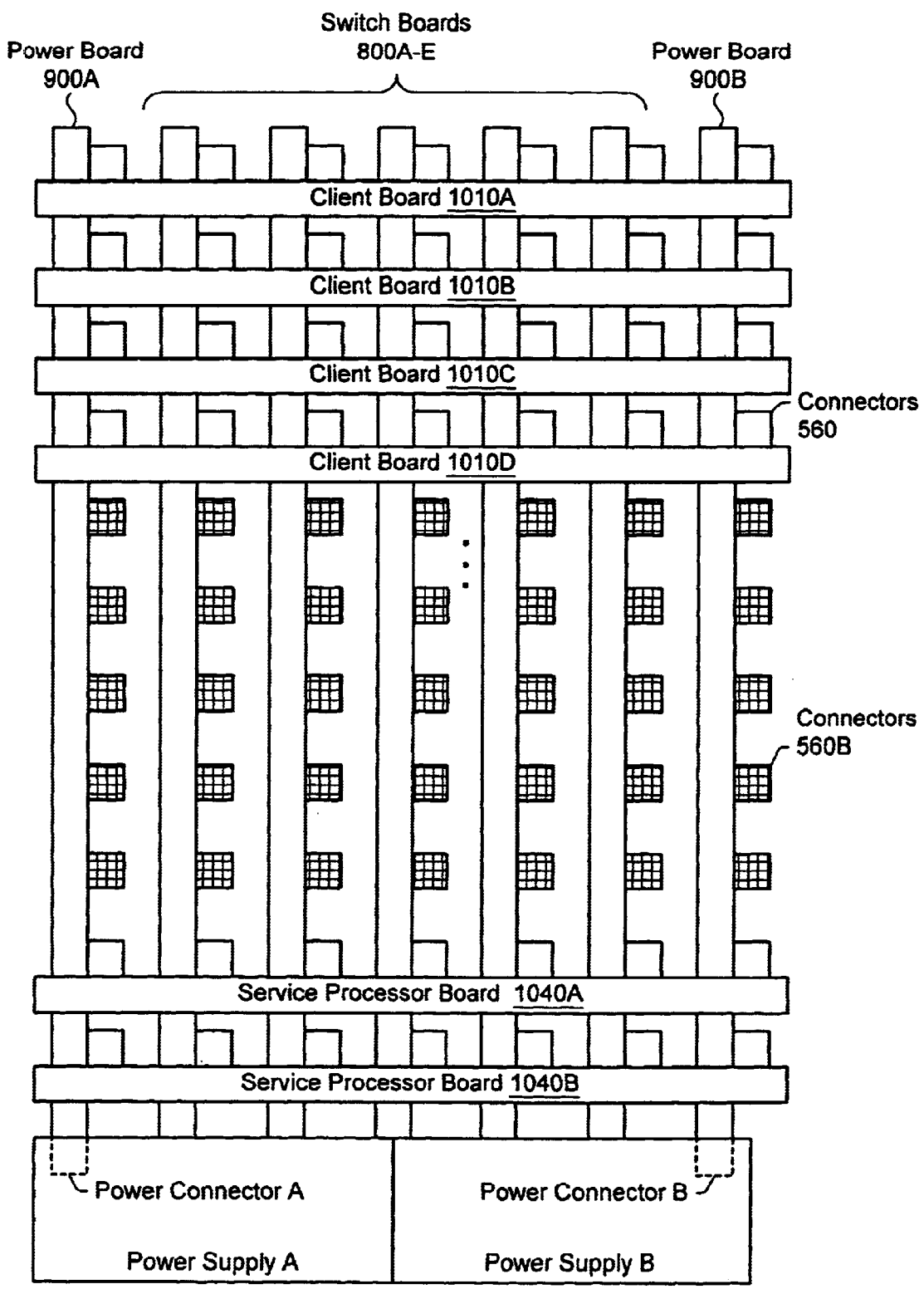
FIG. 10 is a diagram illustrating the rear view of one embodiment of the computer system of FIG. 1.

Turning to FIG. 9, a diagram of one embodiment of a power distribution board is shown. Power board 900 includes a circuit board including a plurality of connectors 960 and a plurality of circuit breakers 910. Power board 900 also includes a power supply connector 920. Power board 900 also includes a plurality of power traces 925 and ground traces 930 which may interconnect circuit breakers 910 to power supply connector 920. Power board 900 is configured to distribute 48V power and ground from a system power supply (not shown in FIG. 9) to the client boards and service processor boards (not shown in FIG. 9). It is noted that although power and ground traces are used to convey power and ground between power supply connector 920 and circuit breakers 910, it is contemplated that other embodiments may include multiple layers and may use power and ground buses or power and ground planes or a combination of traces, buses and planes to convey power and ground. It is further noted that power board 900 may also include additional functionality as necessary.

Power supply connector 920 may be positioned along one edge of power board 900 such that when positioned within a computer system, power supply connector 920 may mate with a corresponding connector within a power supply. In the illustrated embodiment, power supply connector 920 is located on the bottom edge of power board 900. However, it is contemplated that in other embodiments, the bottom edge may be a side edge or a top edge depending on the orientation of the computer system as a whole.

Each of circuit breakers 910 may be configured to interrupt the flow of current through a given one of connectors 560B to prevent excessive current from flowing. As will be described in greater detail below, this feature may allow client and service processor boards to be connected to and disconnected from power board 900 while power is on. In addition, power board 900 may be removed or installed while power is on. Circuit breakers 910 may be configured to disconnect or 'trip' during a short circuit or over-current condition. Further, circuit breakers 910 may be reset, once they are tripped, thereby allowing the circuit to be re-energized after any problem has been corrected.

Connectors 560B are configured to convey power and ground to the various dual client boards and to the service processor boards (not shown in FIG. 9). Each of connectors 560B may be physically arranged along one edge and mounted to one side of power board 900. When power board 900 is installed, each of connectors 560B may be detachably mated to a corresponding connector (560A) on the dual client boards and the service processor boards. It is noted that the number of connectors in the present embodiment may be dependent upon the size of power board 900 which may be dependent upon the number of client boards that the computer system is designed to use. Thus it is contemplated that any suitable number of connectors may be used.

It is noted that each of the circuit boards described above in FIG. 5 through FIG. 9 may include multiple layers and include signal traces as well as signal planes. Further, it is noted that the functionality associated with the various components of the printed circuit boards of FIG. 5 through FIG. 9 may be embodied in one or more integrated circuit chips which may be mounted to the circuit boards. It is further noted that the circuit boards may be printed circuit boards or other types of circuit boards.

Figure 11A:
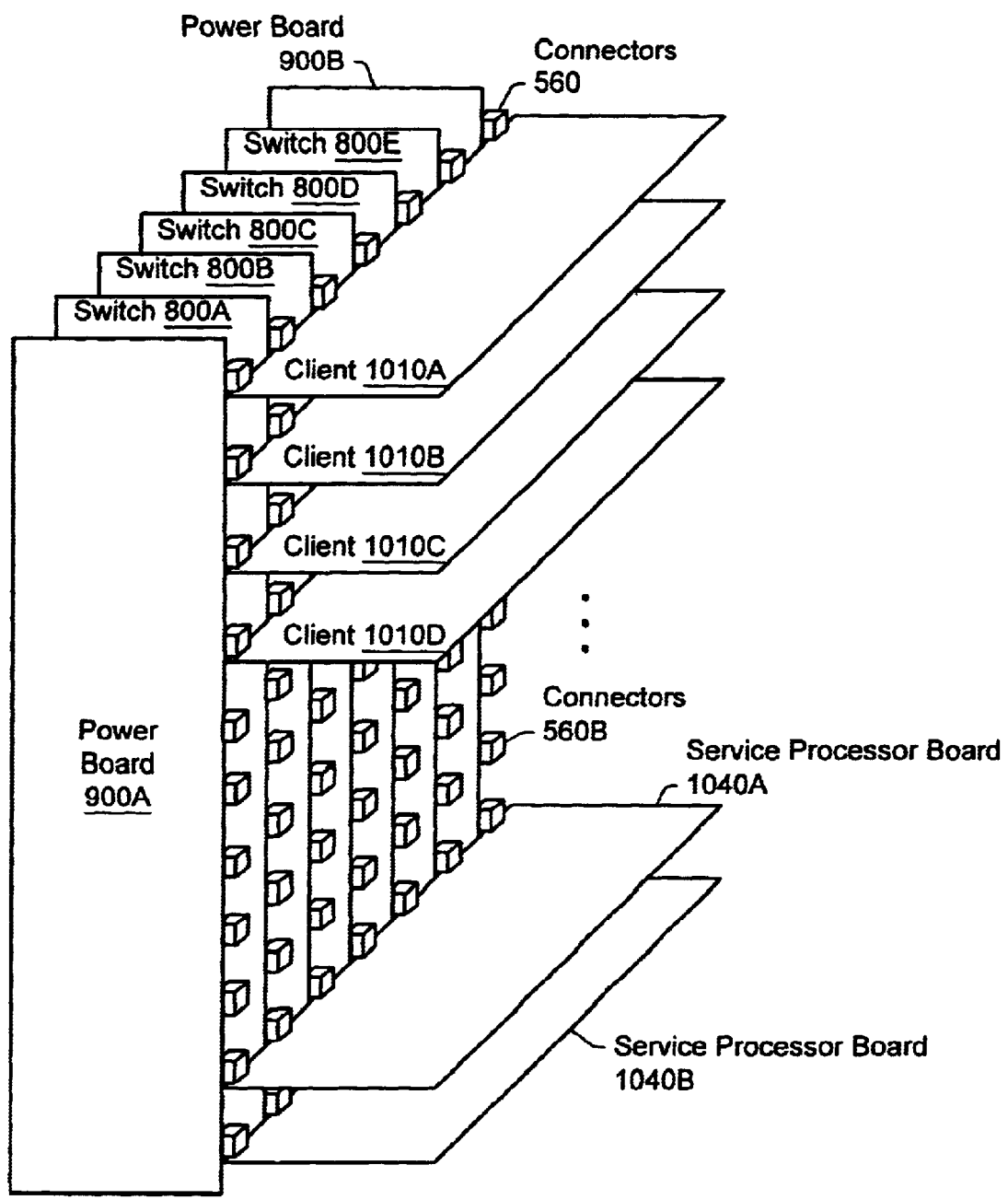
FIG. 11A is a perspective view diagram of one embodiment of the computer system of FIG. 1.
Figure 11B:
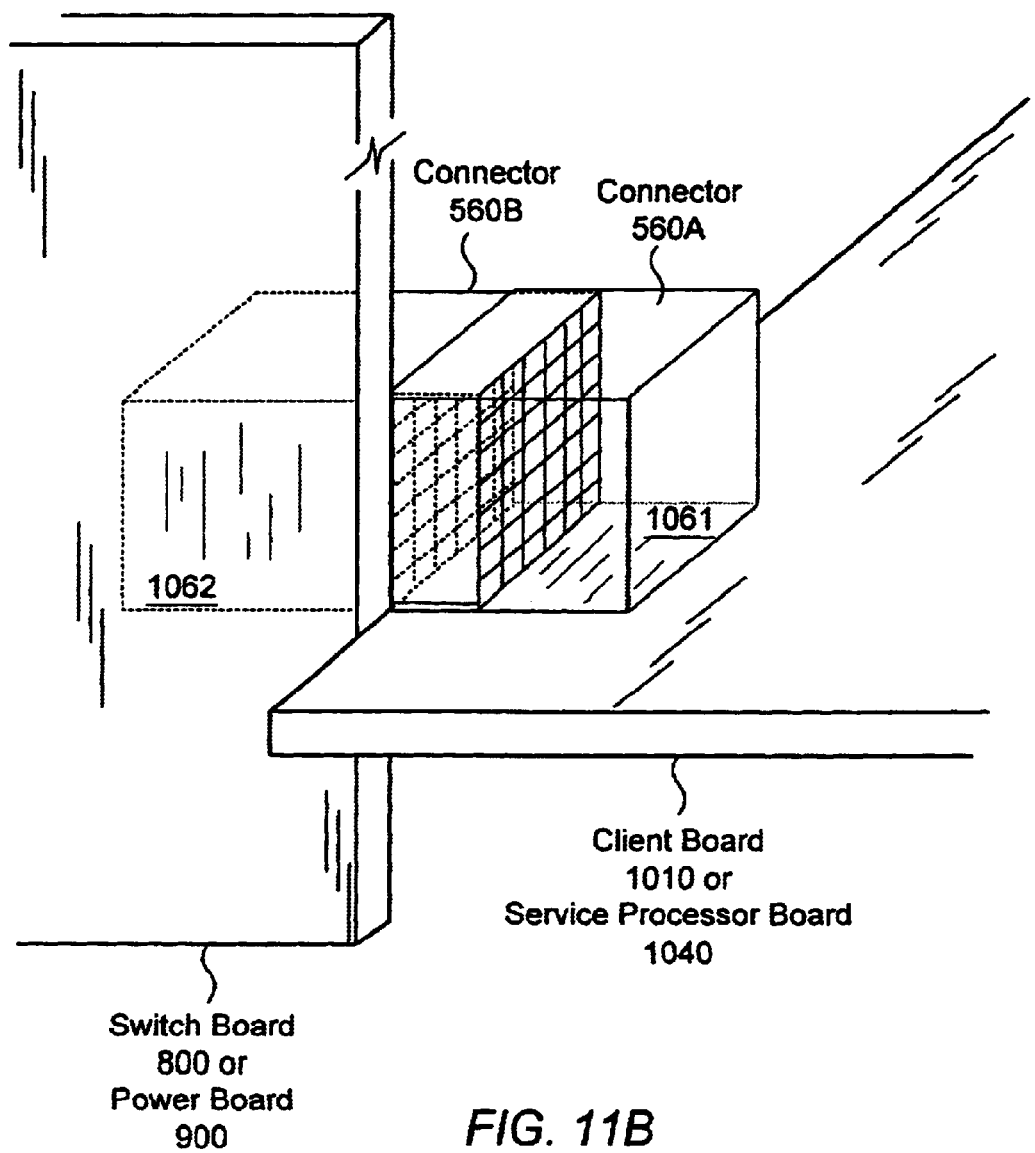
FIG. 11B is an exploded view diagram of one embodiment of a board connector and the orientation of two mated boards.

FIG. 10 through FIG. 11B illustrate different views of one embodiment of computer system 10 of FIG. 1. In FIG. 10, the rear view is shown. In FIG. 11A, a perspective view is shown, and in FIG. 11B an exploded view of the orientation of two mated boards is shown. Circuit components that correspond to those shown in FIG. 1–FIG. 9 are numbered identically for clarity and simplicity.

Turning now to FIG. 10 a diagram illustrating the rear view of one embodiment of computer system 10 of FIG. 1 is shown. FIG. 10 illustrates the physical positioning of the various circuit boards described above. As noted above, the arrangement of the various circuit boards may provide a centerplaneless computer system design. Computer system 10 includes five switch boards labeled 800A–E, two power boards labeled 900A and 900B, four client boards labeled 1010A–D and two service processor boards labeled 1040A–B. Computer system 10 also includes two power supplies: A and B. In addition, connectors 560A of FIG. 5–FIG. 7 and connectors 560B of FIGS. 8–9 are shown collectively as connectors 560 when mated together. It is noted that although only four client boards 1010, two power boards 900 and five switch boards 800 are shown, other embodiments are contemplated which may use other numbers of these boards.

Power boards 900A–B and switch boards 800A–E are shown in the vertical plane. Switch boards 800A–E are located between power boards 900A–B. Switch boards 800A–E and power boards 900A–B are also shown substantially parallel to one another and forming an array of boards. Client boards 1010A–D and service processor boards 1040A–B are shown in the horizontal plane. The vertical boards are substantially orthogonal with respect to the horizontal boards and may form a matrix of rows and columns when viewed from the front or the rear. Client boards 1010A–D and service processor boards 1040A–B are also shown substantially parallel to one another and also form an array of boards. The two arrays of boards are substantially perpendicular to each other. As described above in conjunction with the descriptions of FIG. 5 through FIG. 9, each circuit board has a series of connectors (e.g. 560A and 560B) that convey power, ground and signals between boards and are used to detachably mate the two arrays of boards together. It is contemplated that in other embodiments, the entire system may be re-oriented such that the terms vertical and horizontal may not describe the same boards. However, the relationship between and among boards may be the same.

As described above and further illustrated in the perspective view of FIG. 11A, the physical configuration of the system may provide independent maintenance access to each system board in the computer system such that any system board may be removed and replaced without removing other system boards. This may be in contrast to a computer system which uses a common centerplane, which may not be removed independently of any other system boards.

Referring to the exploded view diagram of FIG. 11B, two system boards are shown detachably mated together by connector 560. As described above connector 560 includes two portions: connector 560A and connector 560B. Connector 560B may include multiple internal connections and may be mounted to one surface 1062 of the vertical circuit board using any suitable mounting technique. The internal connections of connector 560B make contact with signal traces or other connections (not shown) on the vertical circuit board. In the illustrated embodiment, the vertical circuit board is shown as either a switch board 800 or a power board 900. Connector 560A may also include multiple signal connections and may be mounted to one surface 1061 of the horizontal circuit board using any suitable mounting technique. The internal connections of connector 560B make contact with signal traces or other connections (not shown) on the horizontal circuit board. In the illustrated embodiment, the horizontal board is shown as either a client board 1010 or a service processor board 1040. As shown, connector 560A and connector 560B are mated together such that the boards are positioned in a substantially orthogonal orientation with respect to each other. Further, for each of the multiple signal connections within connectors 560A and 560B, a corresponding ground return path (not shown) which is proximate to each signal connection may be provided.

Referring collectively to FIG. 5–FIG. 11B, power supply A and power supply B of FIG. 10 are configured to provide redundant 48V power to the computer system. Power supply A provides 48V and ground to power board 900A via power connector A and power supply B provides 48V and ground to power board 900B via power connector B. Each of power supplies A and B includes an AC power cord for connection to an independent AC source. Each of power supplies A and B may convert AC to 48VDC.

As described above, power boards 900A–B are each configured to distribute 48VDC to client boards 1010A–D and to service processor boards 1040A–B. Service processor boards 1040A–B are configured to redundantly distribute the 48VDC, A and B, to each of switch boards 800A–E. This power distribution scheme allows both the vertical and horizontal boards to be redundantly powered. If there is a failure of any part of the power distribution system, the computer system may continue to operate normally. Further, the failed power component may be removed and replaced during system operation. Thus, the power distribution scheme in the illustrated embodiment is intended to prevent any single point of failure within the power distribution system from causing a catastrophic shut down or system crash. It is noted that in alternative embodiments, it is contemplated that client boards 1010A–D may be used to distribute 48VDC, A and B to each of switch boards 800A–E.

It is further noted that although two power boards are used in the system described above, other embodiments are contemplated which may use different numbers of power boards to distribute power. For example in such a system, N+1 power boards may be provided, and N boards may be operational and necessary to supply power at any given time. Thus the redundant board may be used in the event of a failure of one of the N power boards. Therefore, in the embodiments described above which use two boards, N is equal to 1. However, in other embodiments, N may equal 2 or more.

In addition, any component in the computer system, (e.g. a power board 900, a power supply, service processor board 1040, a switch board 800 and a client board 1010) may be removed and replaced while the computer system continues to operate. This feature is sometimes referred to as "hot swapping" a component. Thus, the physical implementation illustrated in FIGS. 10–11B is intended to provide hot swappable capability to any system component. It is noted that in one embodiment, more than one component may be hot swapped at any given time.

Further, circuit breakers 910 of FIG. 9 may trip if current faults are detected. For example, a faulty component, pins and connections within connectors 560 damaged during insertion of two boards, may each draw excessive current. If unprotected, excessive currents may burn system components, short out a given power supply and cause a catastrophic system shutdown.

As described above in conjunction with FIGS. 3A–4D and FIG. 8, another feature of the system that may enable the system hot swap capability is the 5-way bit slicing of the address and data network. Each of switch boards 800A–E represents one of the slices. Thus, as described in FIG. 8, there are 5 address switch chips and 5 data switch chips per slice in the illustrated embodiment. A failure of any switching component may be overcome by a fail-over mechanism. Since ECC codes are sent with address and data packets and the parity information is conveyed on a redundant slice, any information lost due to faulty switch board components of one slice may be reconstructed. Further, if a switch board 800 is faulty and removed, the address and data information may be conveyed over the four remaining slices as described above.

In addition to providing redundant 48V power distribution to switch boards 800A–E, service processor boards 1040A–B may be configured to be redundant system controllers each capable of independently configuring system resources. Service processor boards 1040A–B may also be configured to provide test and diagnostic functions to diagnose system component failures through the service interface circuits located on each of client boards 1010A–D and switch boards 800A–E. The service processor boards 1040A–B may also be used to partition the computer system into different domains. Additionally, service processor boards 1040A–B may be used to initialize system components, such as clients, and to reconfigure the system when circuit boards are removed and/or installed.

It is noted that, power boards 900A–B are located in the two outermost positions or 'slots' to the left and right of switch boards 800A–E. It is noted that the components on the various client boards may be positioned to minimize lead lengths between switch boards 800A–E and each client board. In addition, positioning switch boards 800A–E side-by-side with no intervening boards of another type may also minimize lead lengths. Further, the positioning of power boards 900A–B and switch boards as shown may provide symmetry in the line lengths which may provide more uniform clock domain distribution among the various boards. However in alternative embodiments it is contemplated that power boards 900A–B and switch boards 800A–E may be positioned in any vertical slot as necessary.

Figure 12A:
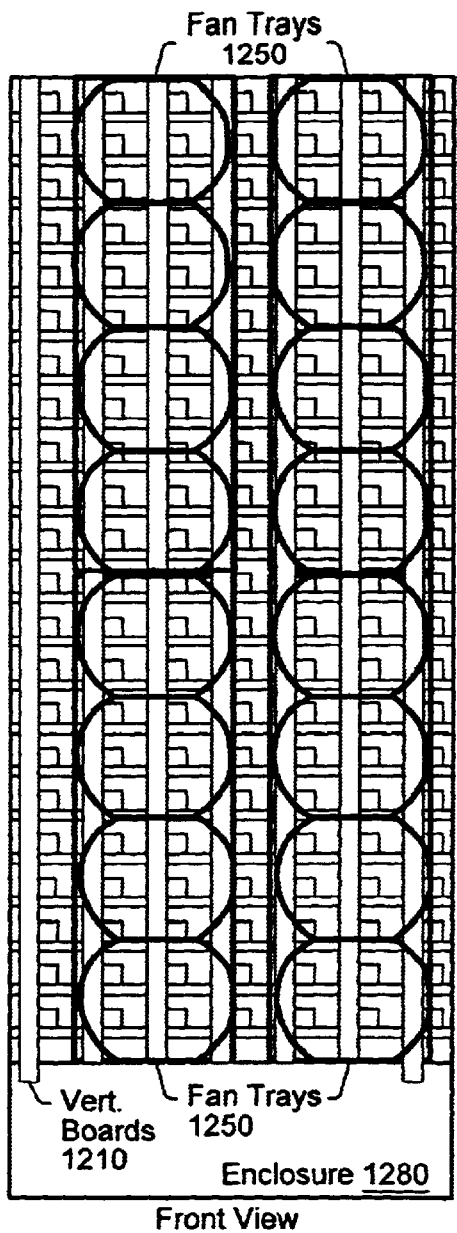
FIG. 12A is a diagram illustrating the front view of one embodiment of the computer system of FIG. 1.
Figure 12B:
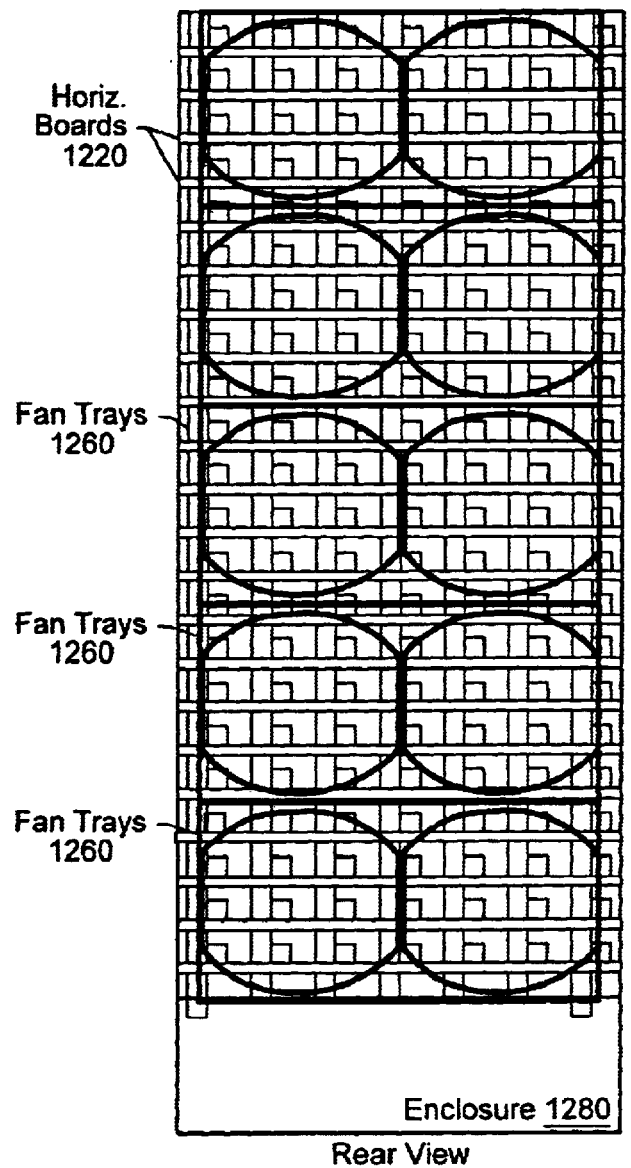
FIG. 12B is a diagram illustrating the rear view of one embodiment of the computer system of FIG. 1.
Figure 12C:
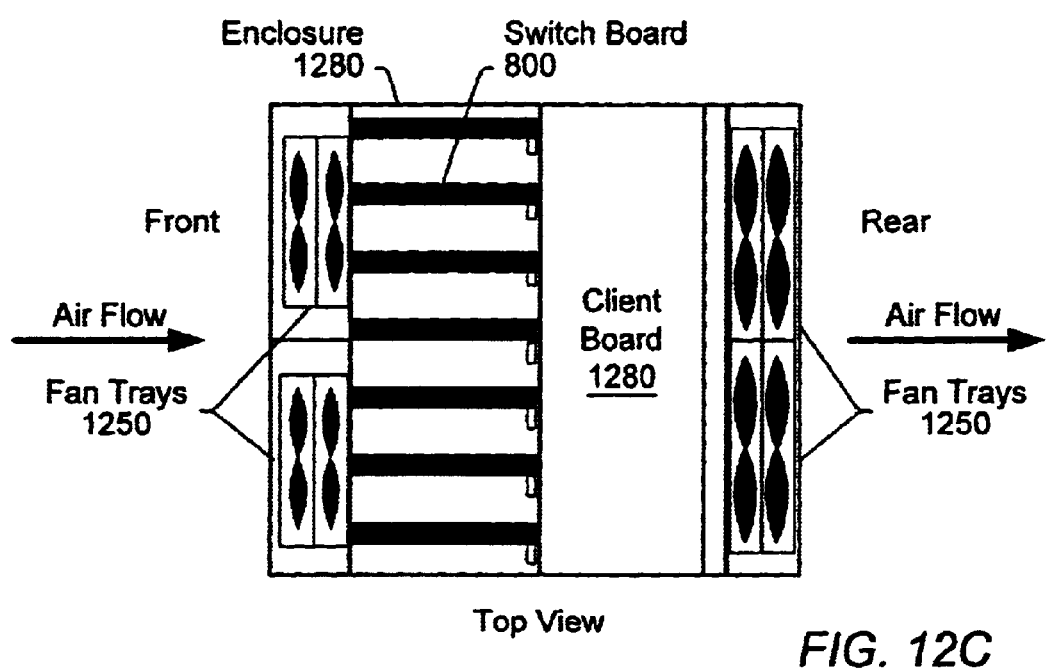
FIG. 12C is a diagram illustrating the top view of the computer system shown in FIG. 12A and FIG. 12B.

FIGS. 12A through 12C illustrate aspects associated with cooling fan arrangements and air flow of computer system 10 of FIG. 1. Referring to FIG. 12A, a diagram illustrating the front view of one embodiment of the computer system of FIG. 1 including the system enclosure is shown. The system includes an enclosure 1280 which houses the system boards described above in conjunction with the descriptions of FIG. 5–FIG. 11 and fan trays 1250.

Fan trays 1250 include a plurality of cooling fans arranged in removable trays for accessibility. In the illustrated embodiment, there are four fan trays, each including four fan pairs. As will be shown below in FIG. 12C, the fans may be stacked two or more deep. Thus, each fan tray 1250 may include 8 fans. The fan trays are arranged vertically since they are physically closest to the vertical boards 1210 within enclosure 1280. For example, fan trays 1250 when removed provide access to the vertical boards 1210. It is noted that although four fan trays are shown, other embodiments are contemplated which may include other numbers of fan trays. Similarly, other numbers of fans may be used in each fan tray.

Referring to FIG. 12B, a diagram illustrating the rear view of one embodiment of the computer system of FIG. 1 including the system enclosure is shown. The system includes enclosure 1280 which houses the system boards described above in conjunction with the descriptions of FIG. 5–FIG. 11 and fan trays 1260.

Fan trays 1260 include a plurality of cooling fans arranged in removable trays for accessibility. In the illustrated embodiment, there are five fan trays, each including two fan pairs. As will be shown below in FIG. 12C, the fans may be stacked two or more deep. Thus, each fan tray may include four fans. The fan trays are arranged horizontally since they are physically closest to the horizontal boards 1220 within enclosure 1280. For example, fan trays 1260 when removed provide access to the horizontal boards 1220. It is noted that although five fan trays are shown, other embodiments are contemplated which may include other numbers of fan trays. Similarly, other numbers of fans may be used in each fan tray.

Turning to FIG. 12C, a diagram illustrating the top view of one embodiment of the computer system of FIGS. 12A–B including the system enclosure is shown. In this view, the arrows depict the general direction of the airflow through enclosure 1280. This arrangement provides a push-pull airflow from front to rear. Thus, the fans in fan trays 1250 may force cooler intake air across the vertical boards 1210 and then the horizontal boards 1220. The fans in fan trays 1260 exhaust the forced intake air out through the rear of enclosure 1280. The airflow moves in a substantially straight line through the board matrix from the intake fans 1250 to the exhaust fans 1260. This direct airflow may result in more efficient cooling and a smaller enclosure than systems employing multiple air plenums which are used to turn the air flow one or more times before exhausting it from the enclosure. It is noted that although the airflow is described as flowing front to rear, alternative embodiments may cause air to flow from rear to front.

The fan arrangement shown is illustrative of 2N fan redundancy. Each of fan trays 1250 and 1260 are shown being two fans deep. Thus if one of the two deep fans fails, the remaining fan may still provide sufficient cooling airflow to the system boards. In addition, the push-pull redundancy allows for fan tray removal during system operation. Fan trays 1250 and 1260 may be removed to allow access to system boards. For example if a vertical board fails, one of fan trays 1250 may be removed to allow access to the failed vertical board. Fan trays 1260 will continue to provide pull airflow without the push air. Similarly, if one of fan trays 1260 is removed, fan trays 1250 may continue to provide push airflow. Thus, the various cooling fans may also be considered hot swappable.

It is noted that although in the embodiment described above, circuit boards 500, 600, 700, 800 and 900 are detachably mated to each other by connectors, in another embodiment, these system boards may be permanently connected to each other. In yet another embodiment, the system boards may be interconnected using cables.

It is noted that the embodiment described above in conjunction with the descriptions of FIG. 5 through FIG. 12 includes system boards such as client boards, switch boards and power distribution boards. However it is contemplated that in other embodiments, the system boards which form a portion of an electronic system may comprise circuit boards that include components which have other functionality.

Numerous variations and modifications will become apparent to those skilled in the art once the above disclosure is fully appreciated. It is intended that the following claims be interpreted to embrace all such variations and modifications.

What is claimed is:

1. A system comprising:
 a first array of circuit boards, wherein each of the circuit boards of the first array of circuit boards is substantially parallel to each other;
 a second array of circuit boards, wherein each of the circuit boards of the second array of circuit boards is substantially parallel to each other;
 wherein the first array of circuit boards and the second array of circuit boards are positioned substantially perpendicular to each other;

a first fan positioned proximate to said first array of circuit boards; and a second fan positioned proximate to said second array of circuit boards;

wherein said first fan is positioned to force intake air across said first and said second arrays of circuit boards and said second fan is positioned to exhaust said forced intake air after said forced intake air passes over said second array of circuit boards.

2. The system as recited in claim 1, wherein said first fan and said second fan are each hot swappable.

3. The system as recited in claim 1, wherein said first fan is configured to provide access to said first array of circuit boards if removed during operation of said system.

4. The system as recited in claim 1, wherein said second fan is configured to provide access to said second array of circuit boards if removed during operation of said system.

5. The system as recited in claim 1, wherein said first fan is configured to provide adequate cooling air for said first and said second arrays of circuit boards.

6. The system as recited in claim 1, wherein said second fan is configured to provide adequate cooling air for said first and said second arrays of circuit boards.

7. The system as recited in claim 1, wherein a portion of said first array of circuit boards are power distribution circuit boards.

8. The system as recited in claim 1, wherein a portion of said first array of circuit boards are switch circuit boards each including address and data switches.

9. The system as recited in claim 1, wherein a portion of said second array of circuit boards are processor boards each including one or more processors.

10. The system as recited in claim 1, wherein a portion of said second array of circuit boards are memory boards each including a memory controller and one or more memory subsystems.

11. The system as recited in claim 1, wherein a portion of said second array of circuit boards are input/output boards each including an input/output bridge.

12. A system comprising:

a first plurality of circuit boards;

a second plurality of circuit boards;

wherein said first plurality of circuit boards is coupled to said second plurality of circuit boards forming a matrix of boards including a plurality of rows and a plurality of columns;

a first plurality of fans and a second plurality of fans for cooling said first and said second plurality of circuit boards;

wherein said first plurality of fans is positioned to force intake air through said plurality of rows and said plurality of columns and said second plurality of fans is positioned to exhaust said forced intake air; and wherein said intake air flows from said first plurality of fans across said first plurality of circuit boards, across said second plurality of circuit boards to said second plurality of fans.

13. The system as recited in claim 12 wherein each of said first plurality of fans and each of said second plurality of fans are hot swappable.

14. The system as recited in claim 12, wherein said first plurality of fans is configured to provide access to said first array of circuit boards if removed during operation of said system.

15. The system as recited in claim 12, wherein said second plurality of fans is configured to provide access to said second array of circuit boards if removed during operation of said system.

16. The system as recited in claim 12, wherein said first plurality of fans is configured to provide adequate cooling air for said first and said second arrays of circuit boards.

17. The system as recited in claim 12, wherein said second plurality of fans is configured to provide adequate cooling air for said first and second arrays of circuit boards.

18. The system as recited in claim 12, wherein a portion of said first plurality of circuit boards are power distribution circuit boards.

19. The system as recited in claim 12, wherein a portion of said first plurality of circuit boards are switch circuit boards each including address and data switches.

20. The system as recited in claim 12, wherein a portion of said second plurality of circuit boards are processor boards each including one or more processors.

21. The system as recited in claim 12, wherein a portion of said second plurality of circuit boards are memory boards each including a memory controller and one or more memory subsystems.

22. The system as recited in claim 12, wherein a portion of said second plurality of circuit boards are input/output boards each including an input/output bridge.

23. A system comprising:

a first array of circuit boards, wherein each of the circuit boards of the first array of circuit boards is substantially parallel to each other;

a second array of circuit boards, wherein each of the circuit boards of the second array of circuit boards is substantially parallel to each other;

wherein the first array of circuit boards and the second array of circuit boards are positioned substantially perpendicular to each other;

a first plurality of fans positioned proximate to said first array of circuit boards; and a second plurality of fans positioned proximate to said second array of circuit boards;

wherein said first plurality of fans is positioned to force intake air across said first and said second arrays of circuit boards and said second plurality of fans is positioned to exhaust said force intake air after said forced intake air passes over said second array of circuit boards.

24. The system as recited in claim 23, wherein each of said first plurality of fans and each of said second plurality of fans is hot swappable.

25. The system as recited in claim 23, wherein said first plurality of fans is configured to provide access to said first array of circuit boards if removed during operation of said system.

26. The system as recited in claim 23, wherein said second plurality of fans is configured to provide access to said second array of circuit boards if removed during operation of said system.

27. The system as recited in claim 23, wherein said first plurality of fans is configured to provide adequate cooling air for said first and said second arrays of circuit boards.

28. The system as recited in claim 23, wherein said second plurality of fans is configured to provide adequate cooling air for said first and said second arrays of circuit boards.

29. A method for cooling a computer system, said method comprising:

providing a first array of circuit boards, wherein each of the circuit boards of the first array of circuit boards is substantially parallel to each other;

providing a second array of circuit boards, wherein each of the circuit boards of the second array of circuit boards is substantially parallel to each other;

positioning the first array of circuit boards substantially perpendicular to the second array of circuit boards;

positioning a first plurality of fans proximate to said first array of circuit boards;

positioning a second plurality of fans proximate to said second array of circuit boards; and operating said first plurality of fans to force intake air across said first and said second arrays of circuit boards and operating said second plurality of fans to exhaust said forced intake air after said forced intake air passes over said second array of circuit boards.

30. A computer system comprising:

a first array of circuit boards, wherein each of the circuit boards of the first array of circuit boards is substantially parallel to each other;

a second array of circuit boards, wherein each of the circuit boards of the second array of circuit boards is substantially parallel to each other;

means for positioning the first array of circuit boards and the second array of circuit boards such that the first array of circuit boards is substantially perpendicular to the second array of circuit boards; and a first plurality of fans positioned proximate to said first array of circuit boards; and a second plurality of fans positioned proximate to said second array of circuit boards;

wherein said first plurality of fans is positioned to force intake air across said first and said second arrays of circuit boards and said second plurality of fans is positioned to exhaust said forced intake air after said forced intake air passes over said second array of circuit boards.

\* \* \* \* \*

UNITED STATES PATENT AND TRADEMARK OFFICE
CERTIFICATE OF CORRECTION

PATENT NO. : 6,768,640 B2 Page 1 of 1
DATED : July 27, 2004
INVENTOR(S) : Doblar et al.

It is certified that error appears in the above-identified patent and that said Letters Patent is hereby corrected as shown below:

<u>Column 18,</u>
Line 42, please change "force" to -- forced --

Signed and Sealed this

Eighth Day of February, 2005

JON W. DUDAS
*Director of the United States Patent and Trademark Office*